(12) United States Patent
Liao et al.

(10) Patent No.: US 11,436,400 B2
(45) Date of Patent: Sep. 6, 2022

(54) OPTIMIZATION METHOD FOR GRAPH PROCESSING BASED ON HETEROGENEOUS FPGA DATA STREAMS

(71) Applicant: Huazhong University of Science and Technology, Hubei (CN)

(72) Inventors: Xiaofei Liao, Hubei (CN); Qingxiang Chen, Hubei (CN); Long Zheng, Hubei (CN); Hai Jin, Hubei (CN); Pengcheng Yao, Hubei (CN)

(73) Assignee: Huazhong University of Science and Technology, Wuhan (CN)

( * ) Notice: Subject to any disclaimer, the term of this patent is extended or adjusted under 35 U.S.C. 154(b) by 297 days.

(21) Appl. No.: 16/895,545

(22) Filed: Jun. 8, 2020

(65) Prior Publication Data

US 2021/0097221 A1    Apr. 1, 2021

(51) Int. Cl.
| | |
|---|---|
| G06F 30/331 | (2020.01) |
| G06F 16/901 | (2019.01) |
| G06F 9/38 | (2018.01) |
| G06F 9/54 | (2006.01) |
| G06F 12/0806 | (2016.01) |

(52) U.S. Cl.
CPC .......... *G06F 30/331* (2020.01); *G06F 9/3877* (2013.01); *G06F 9/544* (2013.01); *G06F 12/0806* (2013.01); *G06F 16/9024* (2019.01)

(58) Field of Classification Search
CPC .. G06F 30/331; G06F 16/9024; G06F 9/3877; G06F 9/544; G06F 12/0806
See application file for complete search history.

(56) References Cited

U.S. PATENT DOCUMENTS

| | | | |
|---|---|---|---|
| 8,831,271 B2 * | 9/2014 | Sese | G06F 16/9027 345/440 |
| 10,387,037 B2 * | 8/2019 | Venkatesh | G06F 3/0604 |
| 2021/0073287 A1 * | 3/2021 | Hunter | H04L 9/3239 |

FOREIGN PATENT DOCUMENTS

WO    WO-2021212933 A1 * 10/2021    ............ G06T 1/20

* cited by examiner

*Primary Examiner* — Tammara R Peyton
(74) *Attorney, Agent, or Firm* — Michael X. Ye; Rimon, PC

(57) ABSTRACT

The present invention relates to an optimization method for graph processing based on heterogeneous FPGA data streams. The method can balance processing loads between the CPU processing module and the FPGA processing module during acceleration of graph data processing.

7 Claims, 2 Drawing Sheets

OPTIMIZATION METHOD FOR GRAPH PROCESSING BASED ON HETEROGENEOUS FPGA DATA STREAMS

This application claims the benefit of China Patent Application No. 201910938006.6 filed on Sep. 29, 2019, which is incorporated by reference herein in its entirety.

BACKGROUND OF THE INVENTION

1. Technical Field

The present invention relates to graph processing, and more particularly to an optimization method for graph processing based on heterogeneous FPGA data streams.

2. Description of Related Art

Graph processing has attracted more and more attention in academic and industrial worlds due to its good applicability and practicality. For example, graph processing is now applied in the various fields, such as social media, molecular structure relationship for scientific research, advertisement recommendation for e-commerce platforms, and web information. Graph is an abstract data structure that expresses correlative relationship among objects, and can convert relationship among people, products, ideas, facts and interests into information flow or data stream for subsequent storage and calculation. Graph is also useful in data mining and machine learning, such as identifying influential people and information, community discovery, searching for users to push products and advertisement, modeling for complex data having dependency and so on. In a graph structure, vertices and edges are used for description, where in a vertex represents an object, and an edge represents relationship between objects. Data that can be abstracted and described by graphs are called graph data. Graph processing refers to a process where a graph is used as a data model to express and address problems. Representative graph processing machines include Pregel of Google, standalone Graphchi, Cucha dedicated for CPUs and GraphGen dedicated for FPGAs. As compared to the foregoing three processing environments, FPGA-based graph processing is slow in its research and development. As a form of semi-custom circuits, FPGAs address the problem that application specific integrated circuits (ASICs) are difficult to be customized. However, customization of FPGAs consumes resources heavily and needs clock coordination among different modules, leading to excessively long critical path time, which makes FPGAs inferior to CPUs and ASICs in terms of overall frequency. Besides, while FPGAs have higher parallelism than CPUs for the former accommodate multiple flow lines, the existing graph processing approaches do not bring the high parallelism of FPGAs into full play. Due to the two reasons mentioned before, FPGA graph processing is rather limited in terms of efficiency.

The existing FPGA-based graph processing systems are mainly implemented in two types, namely CPU-FPGA-based heterogeneous structures and FPGA-based graph structures.

A CPU-FPGA-based heterogeneous structure takes the respective advantages of a CPU and an FPGA. A CPU is a general processor suitable for low-parallelization applications where fewer threads are involved, yet its operational frequency is quite high and has outstanding instruction design for highly efficient program execution. On the other hand, an FPGA has abundant logic resources, and is ideal for fine-grained flowline parallelism where tens of thousands of threads are to be executed parallelly. It is thus clear that in low-parallelism parallelization cases, CPUs are better than FPGAs, and in high-parallelism parallelization cases, FPGAs are better than CPUs. Given these facts, a CPU-FPGA heterogeneous graph processing system typically has its CPU being in charge of the start/end stages, while assigning the high-parallelism intermediate stage to its FPGA. Such a heterogeneous CPU-FPGA graph processing structure has many advantages: First, the CPU and the FPGA are suitable to deal with different areas, FPGAs are good at high-parallelism applications while CPUs cannot achieve sufficient parallelism. During graph processing, due to the power-law characteristics of graphs, while the majority of vertices are small in degree and can be well handled by CPUs, the minority of vertices are of large degrees that require very high parallelism for efficient processing. A heterogeneous CPU-FPGA structure has the best of both worlds, and provides a great approach to graph processing. Second, an FPGA has a high bandwidth that compensates for shortcomings of its peer CPU in terms of data reading. During graph processing, much more time is used in accessing storage than in calculation, so the bandwidth of a conventional CPU processor is too small to support graph applications. An FPGA usually provides a multi-port high-bandwidth DRAM for data reading, and therefore is superior to, for example, a CPU in terms of graph data reading. This makes a CPU-FPGA combination the optimal solution for bandwidth limits in graph applications.

For example, China Patent Publication No. CN107844433A discloses a heterogeneous, hybrid memory server structure that comprises a CPU calculating board and an NYM board. The CPU calculating board is provided with a CPU chip connected to a DRAM chip. The NVM board is provided with a main FPGA chip connected to a DRAM chip and an NVM. The CPU chip is connected to the main FPGA chip through a QPI bus. The main FPGA chip maintains global cache coherence of the non-volatile memory, so as to realize global memory sharing. The known structure uses a low-power-consumption, high-capacity NVM as its remote memory, and uses a low-capacity, high-speed DRAM as its local memory, so as to build a high-capacity, low-power-consumption, heterogeneous hybrid memory system that performs unified addressing on subsequent memories, thereby improving coupling of heterogeneous memory systems and speed match, in turn ensuring global data coherence.

For example, China Patent Publication No. CN109471732A discloses a method for data distribution in CPU-FPGA heterogeneous multi-core system. The method comprises: compiling a source code into a middle code of a low-level virtual machine LLVM through a Clang front end. The intermediate code of LLVM is executed by the LLVM, and the input data is received to obtain the data access trajectory and instruction trajectory. A dynamic data dependency graph (DDDG) is generated by instruction trajectory to represent the control flow and data flow of the FPGA core. The obtained data access trajectory is sent to the cache simulator, and the cache conflict graph CCG is obtained. The integer linear programming formula is constructed, and the integer linear programming formula is solved according to the dynamic data dependency graph (DDDG) and cache conflict graph (CCG), and the optimal data allocation scheme is obtained.

For example, China Patent Publication No. CN107273331A discloses a heterogeneous computing system and method based on CPU+GPU+FPGA frameworks.

The calculating system includes CPU main computer units, one or more GPU isomeries accelerator modules and one or more FPGA isomeries accelerator modules. The CPU main computer units are communicated to connect with GPU isomeries accelerator module and the FPGA isomeries accelerator module respectively. The CPU main computer units are used for resource management, and processing task is distributed into GPU isomeries accelerator module and/or FPGA isomery accelerator modules. The GPU isomeries accelerator module carries out parallel processing to the task from CPU main computer units. The FPGA isomeries accelerator module carries out serial or parallel processing to the task from CPU main computer units. The heterogeneous computing system can give full play to CPU management and control advantage, GPU parallel processing advantage, FPGA power dissipation ratio of performance and the advantage with flexible configuration, be suitable for different application scenarios, and meet different types of mission requirements.

For example, China Patent Publication No. CN108596885A discloses a quick SAR image change detection method based on CPU+FPGA. The method speeds up to the variation detection of SAR image using CPU+FPGA isomerism parallels, compared with the method for the variation detection of SAR image in the prior art is calculated at CPU, the computation capability of FPGA will be significantly larger than CPU data serial computing ability. And using FPGA with by the way of CPU combination work, FPGA is responsible for the processing parallelization of data in entire algorithm, and CPU is responsible for the scheduling in host side control task and the size of parameter. The present invention carries out parallelization to the algorithm of SAR image variation detection using the multiple programming standard of OpenCL and writes, and the portability of code is relatively high, can be run in different heterogeneous platforms.

China Patent Publication No. CN101165652 discloses a method for simultaneously loading multiple FPGAs using a CPU. The method can be used in a system having plural CPUs and FPGAs and comprises the following steps. Step 1 is loading the bit stream of multi-FPGA files through an FPGA merging process to generate an FPGA load file. In Step 2, the CPU address bus is required to obtain a logical extension of the multi-sheet loading FPGA registers and latches. In Step 3, the CPU reads the loading FPGA extended memory file to said CPU and generates a load by controlling the timing of the latch register and the multi-FPGA or a multi-chip FPGA loading the FPGA. The known method accelerates the speed of the CPU loading of a multi-FPGA, improves reliability and flexibility of the load circuit, and effectively saves the capacity of the external FLASH.

For example, China Patent Publication No. CN108776649A discloses a CPU+FPGA-based heterogeneous computing system and its accelerated method. The CPU+FPGA-based heterogeneous computing system is related to heterogeneous computing, and same calculating task is completed using multiple FPGA accelerator modules collaboration CPU main control units; CPU main control units are responsible for logic judgment, management control, and distribution of computation tasks is carried out to FPGA accelerator modules; FPGA accelerator modules are responsible for accelerating calculating task; It is divided into static region inside FPGA accelerator modules: It is responsible for realizing PCIe-DMA communications, SRIO communications, DDR controls; And dynamic reconfigurable region. The kernel functions that CPU main control units issue are executed, calculating task is accelerated. The present invention is directed to different task types, realizes that the parallel acceleration processing to calculating task is handled with flowing water acceleration, the throughput of task processing can be substantially improved, shorten task execution time, the calculated performance of computer is greatly improved.

By committing the entire graph processing process to the foregoing CPU-FPGA combination, the improved graph processing structure obtains the advantages of using both an FPGA and a CPU alone, but has the following disadvantages. First, to switch the system form the CPU to the FPGA or vice versa, the processor has to stop the current program operation, save the current operational state and processing data, transmit the data to the relevant processor through the PCIe channel, and then resume the operational state. This process is quite time-consuming and may take more than 20% of the total program execution time. Second, when the system is switched from the CPU to the FPGA, the CPU has to stop, and when the system is switched from the FPGA to the CPU, the FPGA has to stop. The switching involves frequent control works, and is more complicated than performing the entire traversal process on a single processor.

Since there is certainly discrepancy between the prior art comprehended by the applicant of this patent application and that known by the patent examiners and since there are many details and disclosures disclosed in literatures and patent documents that have been referred by the applicant during creation of the present invention not exhaustively recited here, it is to be noted that the present invention shall actually include technical features of all of these prior-art works, and the applicant reserves the right to supplement the application with the related art more existing technical features as support according to relevant regulations.

SUMMARY OF THE INVENTION

To address the shortcomings of the prior art, the present invention provides an optimization method for graph processing based on heterogeneous FPGA data streams. The optimization method is especially an optimization method for graph processing of data streams based on a CPU+FPGA heterogeneous structure, which can send graph data to a CPU processing module and an FPGA processing module respectively according to the power-law distribution properties of graph for dynamic acceleration processing by means of task assignment, so that the FPGA processing module can work with the CPU processing module to process irregular data streams in the graph data while balancing processing loads between the CPU processing module and the FPGA processing module caused by irregularity of the graph data and thereby obtain a graph processing result. The method comprises: a shared storage module for storing the graph data intended to receive graph processing; the CPU processing module and the FPGA processing module are communicatively connected with the shared storage module, respectively in a parallel manner, so as to enable the CPU processing module and the FPGA processing module to each read at least a part of the graph data in a real-time manner, and to perform graph processing on the parts of the graph data they read, thereby obtaining a CPU graph processing result and/or an FPGA graph processing result; and an integration module integrating the CPU graph processing result and/or the FPGA graph processing result, so as to obtain the graph processing result, the FPGA processing module reading the graph data stored in the shared storage module and, before performing graph processing on the graph data, performing traversal on the graph data based on the power-law distribution properties of the graph data in virtue of editability of the FPGA processing module, so as to acquire at least one irregularity parameter of the irregular data streams in the graph data, and the scheduling module assigning the part of the graph data that agree with the CPU processing module to the CPU processing module for graph processing, so as to obtain the CPU graph processing result, and assigning the other part to the FPGA processing module that has a parallel processing function for graph processing, so as to obtain the FPGA graph processing result by means of matching the at least one irregularity parameter with preset access rules agreeing with the irregularity parameter.

The present invention implements a heterogeneous execution framework for efficient graph processing of data streams based on instruction regularity of graph data. In particular, the execution model performs efficient graph processing in two parts. The first part is using the FPGA processing module to calculate instruction regularity during graph data processing, so as to quantify its control regularity and memory-access regularity, which form the basis of subsequent scheduling algorithms. The second part is using a graph scheduling algorithm to dynamically assign tasks to the conventional CPU processing module and the FPGA processing module according to magnitude of the control regularity and memory-access regularity calculated in the previous part and according to difference between the graph data that are more adaptive to a conventional processor and the graph data that are more adaptive to a data stream, thereby accelerating graph processing. Compared with conventional graph processing method, the present invention introduces a data stream processing model to deal with tasks that are difficult for a conventional CPU, so as to address low-efficiency instruction-level parallelism caused by irregular access of graphs, thereby improving processing efficiency.

According to a preferred mode, the scheduling module the scheduling module are in communicative connection with the FPGA processing module that has at least two threads that can be parallelly processed in a manner that the scheduling module can perform local access on the scheduling module, so that the FPGA processing module when performing traversal on the graph data writes the part of the graph data that disagrees with the CPU processing module into an internal cache in the FPGA processing module corresponding to the at least two threads in a way that allowing parallel processing, so that the FPGA processing module acts as a heterogeneous graph processing accelerator of the CPU processing module and performs parallel graph processing on the part of the graph data that disagree with processing of the CPU processing module in a way that saves communication time writing time, thereby balancing processing loads between the CPU processing module and the FPGA processing module caused by irregularity of the graph data.

According to a preferred mode, at least one threads in the FPGA processing module is configured to perform traversal on the graph data following preset traversal rules in virtue of the editability of the FPGA processing module, and the at least one thread is in communicative connection with the scheduling module through a local cache, the step of performing traversal on the at least one thread at least comprising: selecting at least one child vertex from the graph data as a start point for traversal; reading child vertex data of the at least one child vertex; according to a structure of the graph data, reading target child vertices adjacent to the child vertex and edges between two adjacent child vertices; reading child vertex data of the target child vertices and edge data of the edges; and loading the child vertex data of the at least one child vertex, the target child vertices, the edges of two adjacent child vertices, child vertex data of other child vertices and edge data of the edges to the local cache of the FPGA processing module, so that the scheduling module calculates at least one irregularity parameter of the graph data locally in a way that saves communication time and writing time.

According to a preferred mode, the scheduling module compares the at least one irregularity parameter reading with a corresponding threshold that is a characterization parameter agreeing with processing of the CPU processing module, in which if at least one said irregularity parameter exceeds its corresponding threshold, the scheduling module transmits its corresponding graph data to the FPGA internal cache and/or an on-chip memory, so that the FPGA processing module can perform parallel graph processing on the graph data; and if none of the irregularity parameter exceeds the corresponding threshold, the scheduling module remotely transmits active vertices of the graph data to a CPU internal cache of the CPU processing module, so that the CPU processing module reads the graph data from the shared storage module based on the active vertices and performs graph processing.

According to a preferred mode, the shared storage module is in communicative connection with the at least one thread through the on-chip memory, so that while the FPGA processing module performs graph traversal on the graph data of a previous layer of iteration and/or while the FPGA processing module performs graph processing on the graph data of a previous layer of iteration, the on-chip memory reads the graph data to be processed in a next layer, so that after the FPGA processing module has done the graph processing on the graph data of the previous layer of iteration and/or while the CPU processing module performs graph processing on the graph data of the previous layer of iteration, the graph data of the next layer to be processed can receive graph traversal directly without waiting for the shared storage module to transmit the graph data of the next layer to be processed to the FPGA processing module.

According to a preferred mode, at least one said thread in the FPGA processing module is used to count a number of adjacent child vertices for every said child vertex and generate a number set, and the thread can determine whether the structure of the graph data is regular according to the number set by at least one of: calculating a ratio of a maximum number to a minimum number; calculating a ratio of the maximum number to an average number; calculating a ratio of the minimum number to an average number; calculating a ratio of the minimum number to a median of the numbers; and calculating a ratio of the maximum number to the median of the numbers.

According to a preferred mode, the FPGA module uses data access frequency of the previous layer of iteration and total access duration to calculate average access duration of every said vertex data, thereby identifying change of a graph application in memory-access regularity during calculation, so as to calculate the memory-access regularity for next iteration that is used by the scheduling module to determine whether it is assigned to a CPU for processing or left in a local FPGA data stream accelerator for processing.

According to a preferred mode, the present invention further provides a An optimization system for graph processing based on heterogeneous FPGA data streams, especially an optimization system for graph processing s based on a CPU+FPGA heterogeneous structure, and involving sending graph data to a CPU processing module and an FPGA processing module, respectively, according to power-law distribution properties of a graph by task assignment for dynamic acceleration, so that the FPGA processing module works with the CPU processing module to process irregular data streams in the graph data while balancing processing loads between the CPU processing module and the FPGA processing module caused by irregularity of the graph data and thereby obtain a graph processing result; the system comprising: a shared storage module for storing the graph data intended to receive graph processing; the CPU processing module and the FPGA processing module, wherein the CPU processing module and the FPGA processing module are communicatively connected with the shared storage module, respectively in a parallel manner, so as to enable the CPU processing module and the FPGA processing module to each read at least a part of the graph data in a real-time manner, so that the CPU processing module and/or the FPGA processing module perform graph processing on the parts of the graph data they read, thereby obtaining a CPU graph processing result and/or an FPGA graph processing result; and an integration module integrating the CPU graph processing result and/or the FPGA graph processing result, so as to obtain the graph processing result. The FPGA processing module reads the graph data stored in the shared storage module and, before performing graph processing on the graph data, performs traversal on the graph data based on the power-law distribution properties of the graph data in virtue of editability of the FPGA processing module, so as to acquire at least one irregularity parameter of the irregular data streams in the graph data. A scheduling module assign a part of the graph data that agree with the CPU processing module to the CPU processing module for graph processing, so as to obtain the CPU graph processing result, and assign the other part to the FPGA processing module that has a parallel processing function for graph processing, so as to obtain the FPGA graph processing result by means of matching the at least one irregularity parameter with preset access rules agreeing with the irregularity parameter.

According to a preferred mode, in the system, the scheduling module the scheduling module are in communicative connection with the FPGA processing module that has at least two threads that can be parallelly processed in a manner that the scheduling module can perform local access on the scheduling module, so that the FPGA processing module when performing traversal on the graph data writes the part of the graph data that disagrees with the CPU processing module into an internal cache in the FPGA processing module corresponding to the at least two threads in a way that allowing parallel processing, so that the FPGA processing module acts as a heterogeneous graph processing accelerator of the CPU processing module and performs parallel graph processing on the part of the graph data that disagree with processing of the CPU processing module in a way that saves communication time and writing time, thereby balancing processing loads between the CPU processing module and the FPGA processing module caused by irregularity of the graph data.

According to a preferred mode, the present invention further provides a scheduling method for graph data based on a CPU+FPGA heterogeneous system, being configured to divide irregular data streams of the graph data according to at least one parameter of the irregular data streams in virtue of editability of an FPGA, so as to leverage respective advantages of an FPGA processing module and a CPU processing module to perform coherent acceleration on the graph data. The FPGA processing module reads the graph data stored in the shared storage module and, before performing graph processing on the graph data, performs traversal on the graph data based on the power-law distribution properties of the graph data in virtue of editability of the FPGA processing module, so as to acquire at least one irregularity parameter of the irregular data streams in the graph data. A scheduling module assign the part of the graph data that agree with the CPU processing module to the CPU processing module for graph processing, so as to obtain the CPU graph processing result, and assign the other part to the FPGA processing module that has a parallel processing function for graph processing, so as to obtain the FPGA graph processing result by means of matching the at least one irregularity parameter with preset access rules agreeing with the irregularity parameter.

The present invention provides a CPU-FPGA-based heterogeneous structure that takes the respective advantages of a CPU and an FPGA. A CPU is a general processor suitable for low-parallelization applications where fewer threads are involved, yet its operational frequency is quite high and has outstanding instruction design for highly efficient program execution. On the other hand, an FPGA has abundant logic resources, and is ideal for fine-grained flowline parallelism where tens of thousands of threads are to be executed parallelly. It is thus clear that in low-parallelism parallelization cases, CPUs are better than FPGAs, and in high-parallelism parallelization cases, FPGAs are better than CPUs. Given these facts, a CPU-FPGA heterogeneous graph processing system typically has its CPU being in charge of the start/end stages, while assigning the high-parallelism intermediate stage to its FPGA. Therefore, such a heterogeneous CPU-FPGA graph processing structure has many advantages: First, the CPU and the FPGA are suitable to deal with different areas, FPGAs are good at high-parallelism applications while CPUs cannot achieve sufficient parallelism. During graph processing, due to the power-law characteristics of graphs, while the majority of vertices are small in degree and can be well handled by CPUs, the minority of vertices are of large degrees that require very high parallelism for efficient processing. A heterogeneous CPU-FPGA structure has the best of both worlds, and provides a great approach to graph processing. Second, an FPGA has a high bandwidth that compensates for shortcomings of its peer CPU in terms of data reading. During graph processing, much more time is used in accessing storage than in calculation, so the bandwidth of a conventional CPU processor is too small to support graph applications. An FPGA usually provides a multi-port high-bandwidth DRAM for data reading, and therefore is superior to, for example, a CPU in terms of graph data reading. This makes a CPU-FPGA combination the optimal solution for bandwidth limits in graph applications.

DETAILED DESCRIPTION OF THE INVENTION

Figure 1:
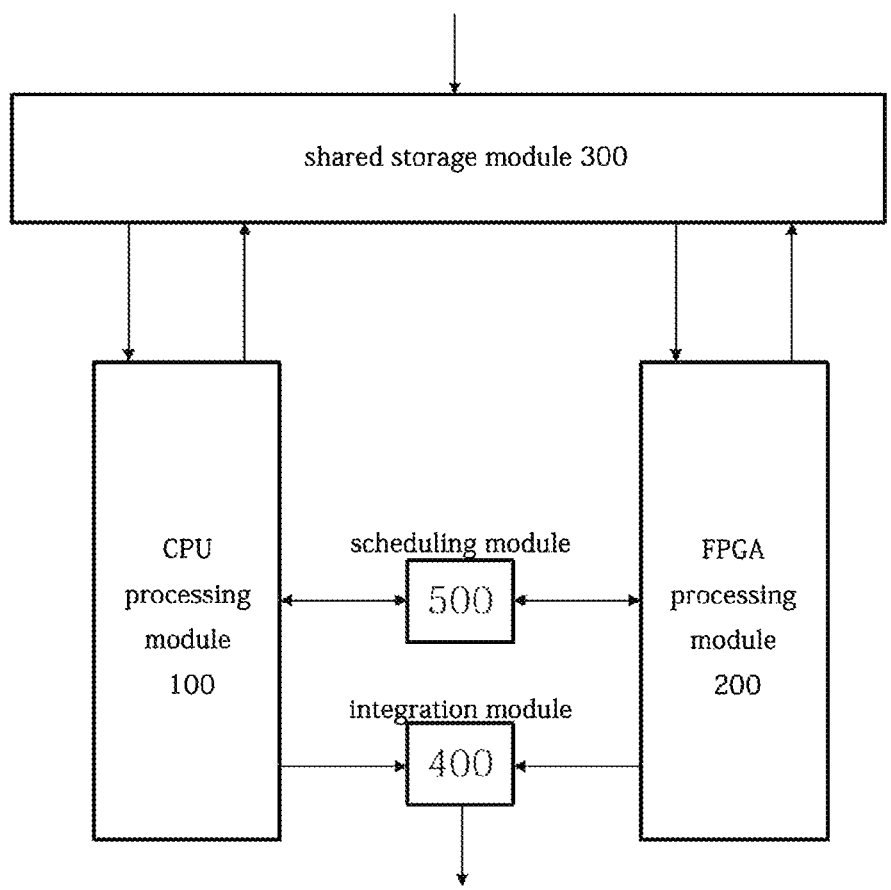
FIG. 1 shows a logic structure of an optimization system of the present invention.

The invention as well as a preferred mode of use, further objectives and advantages thereof will be best understood by reference to the following detailed description of illustrative embodiments when read in conjunction with the accompanying drawings.

Abbreviations

CPU: Central Processing Unit;
FPGA: Field programmable Gate Array;
DRAM: Dynamic Random Access Memory;
BRAM: Block Random Access Memory.

Embodiment 1

The present embodiment discloses an optimization method for graph processing based on heterogeneous FPGA data streams. The present embodiment particularly relates to an optimization method for graph processing of data streams based on a CPU+FPGA heterogeneous structure.

CPU processing module 100: A CPU is a general processor suitable for low-parallelization applications where fewer threads are involved, yet its operational frequency is quite high and has outstanding instruction design for highly efficient program execution.

FPGA processing module 200: An FPGA has abundant logic resources, and is ideal for fine-grained flowline parallelism where tens of thousands of threads are to be executed parallelly.

Due to the power-law characteristics and irregularity of graphs, the minority of vertices is of large degrees and the majority of vertices is small in degree and can be well handled by CPUs. In addition, graph traversal is random, so execution of graph applications is unpredictable and tends to have irregular access. The conventional processors are incompetent to deal with such irregularity when executing graph applications, leading to extremely inefficient graph processing. By determining the execution characteristics of a graph application using novel memory-access regularity and control regularity, an opportunity of optimization is achievable.

A graph has its vertex degrees satisfying power-law distribution. This reflects in the fact that the majority of vertices is of low degrees. The start point for traversal is most probably one with a very low degree, and its surrounding vertices are most probably low-degree ones. This causes a very low parallelism initial stage of traversal. As the iteration for traversal develops, the number of iteration vertices is multiplied. Additionally, since the diameter of a graph must be a certain value. After certain times of iteration, the traversal would reach vertices with high degrees. In other words, parallelism at the intermediate stage of traversal is high. At the last stage of traversal, all the high-degree vertices have been traversed, the vertices to be traversed are low-degree ones, and as the iteration for traversal develops, the degree of parallelism becomes lower and lower, parallelism of the entire traversal of a graph has a pattern that the parallelism is low at two edges and high at the middle.

The disclosed optimization method sends graph data to a CPU processing module 100 and an FPGA processing module 200, respectively, according to power-law distribution properties of a graph by task assignment for dynamic acceleration. Due to power-law distribution properties of graph data, there are irregular data streams that are incompatible with at least one of the CPU processing module 100 and the FPGA processing module 200, further leading to imbalanced processing loads between the CPU processing module 100 and the FPGA processing module 200. To address this problem, the present embodiment provides an optimization method, which enables the FPGA processing module 200 works with the CPU processing module to process irregular data streams in the graph data while balancing processing loads between the CPU processing module and the FPGA processing module caused by irregularity of the graph data and thereby obtain a graph processing result. Due the power-law distribution properties of a graph, the majority of vertices are with low degrees, and only a small portion of the total vertices have high degrees. If scheduling is performed according to variations of memory-access regularity and control regularity during graph processing, most vertices would be assigned to the CPU, and this can cause imbalanced loads and significantly reduced utilization of the processor. Therefore, the scheduling module has to use the number of active vertices generated after operation of this vertex to dynamically assign active vertices to the CPU or FPGA data stream accelerator.

The method at least comprises the following steps.

In S1, the graph data intended to receive graph processing are stored in a shared storage module 300, where in the shared storage module 300 may be a DRAM.

In S2, as shown in FIG. 1, the CPU processing module 100 and the FPGA processing module 200 are communicatively connected with the shared storage module 300, respectively in a parallel manner, so as to enable the CPU processing module 100 and the FPGA processing module 200 to each read at least a part of the graph data in a real-time manner, and to perform graph processing on the parts of the graph data they read, thereby obtaining a CPU graph processing result and/or an FPGA graph processing result.

In S3, an integration module 400 integrates the CPU graph processing result and/or the FPGA graph processing result, so as to obtain the graph processing result.

For accelerating processing of the graph data while balancing the loads between the CPU processing module 100 and the FPGA processing module 200, Steps S1-2a and S1-2b are added between Step S1 and S2.

In S1-2a, the FPGA processing module 200 reads the graph data stored in the shared storage module 300. Preferably, the shared storage module 300 and the on-chip memory 200c are in communicative connection, so that while the FPGA processing module 200 performs graph traversal on the graph data of a previous layer of iteration and/or while the FPGA processing module 200 performs graph processing on the graph data of a previous layer of iteration, the on-chip memory 200c reads the graph data to be processed in a next layer. The on-chip memory 200c may be a BRAM. The FPGA processing module 200, before performing graph processing on the graph data, performs traversal on the graph data based on the power-law distribution properties of the graph data in virtue of editability of the FPGA processing module 200, so as to acquire at least one irregularity parameter of the irregular data streams in the graph data. For example, the irregular parameter includes at least one of: the number of vertices traversed in the previous layer of iteration, the number of active vertices, the access frequency of edges in the previous layer of iteration and the total duration. The active vertices only have to cache the number of the vertex in the previous layer of iteration to the register.

In S1-2b, the scheduling module 500 assigns the part of the graph data that agree with the CPU processing module 100 to the CPU processing module 100 for graph processing, so as to obtain the CPU graph processing result, and assigns the other part to the FPGA processing module 200 that has a parallel processing function for graph processing, so as to obtain the FPGA graph processing result by means of matching the at least one irregularity parameter with preset access rules agreeing with the irregularity parameter. For irregularity parameters related to the access frequency of data in the previous layer of iteration and the total duration of access, when there is frequent out-of-order access of data, the average access efficiency of the data is lowered, and the average data reading time is extended. Graph processing has a high ratio between calculation and memory access, and the speed of graph data processing depends on the time used to access data. Based on the data access frequency and the total access duration of the previous layer of iteration, the average duration for data access can be calculated, thereby determining the variation of memory-access regularity of the graph application during calculation and making it possible to predict memory-access regularity of the next iteration. Based on this information, the decision on assigning the next iteration to the CPU or leaving it to the local FPGA data stream accelerator for processing can be made. If the memory-access regularity is poor, the computing task on the CPU is equivalent to serial execution and is relatively inefficiency. In such a case, the computing task is preferably assigned to the data-stream FPGA for processing. On the contrary, when the memory-access regularity is high, since the data-stream accelerator would consume considerable resources for token creation and communication, it is better to assign the part with high memory-access regularity to the CPU for processing.

Figure 2:
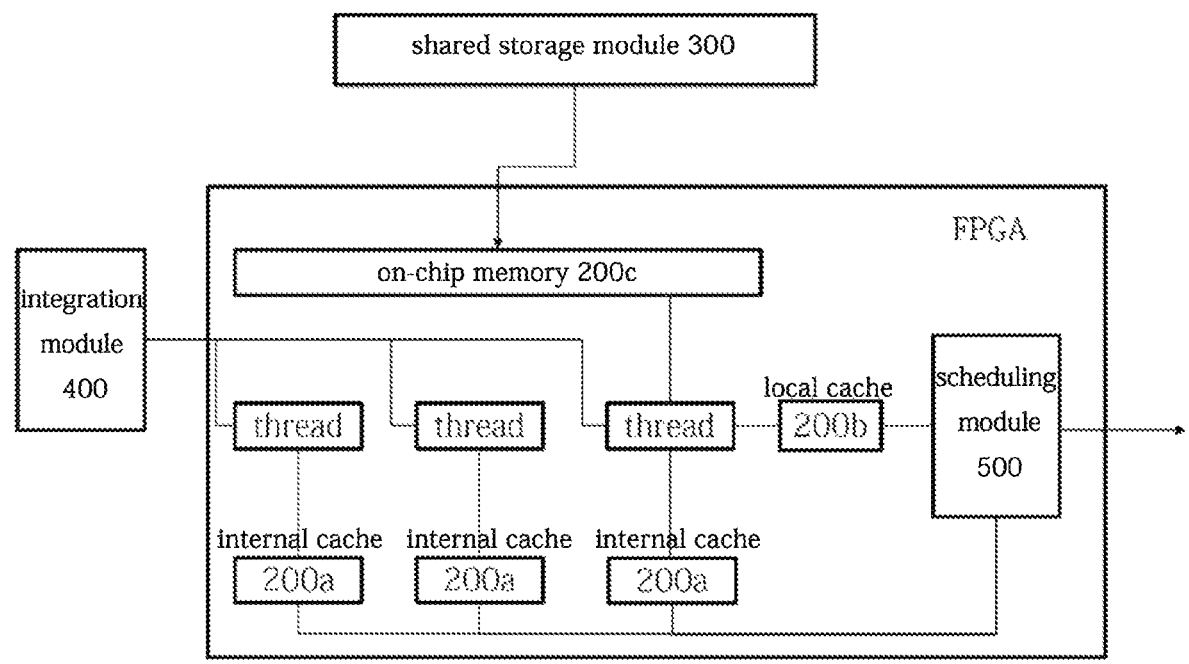
FIG. 2 shows a preferred logic structure of an FPGA module of the present invention.

Preferably, as shown in FIG. 2, the scheduling module 500 are in communicative connection with the FPGA processing module 200 that has at least two threads that can be parallelly processed in a manner that the scheduling module 500 can perform local access. For example, the scheduling module 500 may be installed on the same processing chip as the FPGA processing module 200. The scheduling module has two cache queries, one for the FPGA processing module and the other for the CPU processing module. The FPGA processing module is directly connected to the active vertex query cache in the scheduling module 500 belonging to the FPGA processing module. When the active vertex query contains data, the FPGA processing module extracts active vertices from the query for processing. Since the FPGA processing module 200 has at least two threads that can be processed parallelly, and the two threads are both in communicative connection with the internal cache 200a, the FPGA processing module 200 when performing traversal on the graph data can write the part of the graph data disagreeing with the processing of the CPU processing module 100 to the at least two threads in the FPGA processing module 200 corresponding to the FPGA internal cache 200a in a way that supports parallel processing. By doing so, the FPGA processing module 200 acts as a heterogeneous graph processing accelerator of the CPU processing module 100 and can perform parallel graph processing on the part of the graph data that disagree with processing of the CPU processing module 100 in a way that saves communication time writing time, so as to balance processing loads between the CPU processing module 100 and the FPGA processing module 200 caused by irregularity of the graph data.

Preferably, at least one of the threads in the FPGA processing module 200 is configured to perform traversal on the graph data following preset traversal rules in virtue of the editability of the FPGA processing module 200, and the at least one thread is in communicative connection with the scheduling module 500 through a local cache 200b. The local cache 200b stores the cache of the traversal result. The editability of the FPGA processing module 200 is mainly used for editing the traversal rules. To traverse at least one of the threads, at least the following steps are performed:
    selecting at least one child vertex from the graph data as a start point for traversal;
    reading child vertex data of the at least one child vertex;
    according to a structure of the graph data, reading target child vertices adjacent to the child vertex and edges of the two adjacent child vertices;
    reading child vertex data of the target child vertices and edge data of the edges; and
    loading the child vertex data of the at least one child vertex, the target child vertices, the edges of the two adjacent child vertices, child vertex data of the other child vertices and edge data of the edges to the local cache 200b of the FPGA processing module 200, so that the scheduling module 500 calculates the at least one irregularity parameter of the graph data locally in the way that saves communication time and writing time.

In virtue of editability of the FPGA processing module 200, plural start point sites can be selected, from which the data-stream FPGA performs the parallel, first traversal. The subsequent steps are: reading start point data from the DRAM, through the connected edges, reading target vertex data, uploading edge data to the local cache 200b, performing to update the result to the original point, and adding the new vertices to the active vertex set. The original point is the vertex currently processed. For example, for graph processing, the pagerank value of the current vertex is calculated. After calculation, the pagerank value is recorded into the original point. Then the edges adjacent to the vertex are read and target points, or new vertices, are extracted from the edges. Theses vertices are vertices to be processed, so they are added into the active vertex set to wait for the next round of iteration. They are also the active vertices for the next round of iteration.

Preferably, the scheduling module 500 compares the at least one irregularity parameter reading with a corresponding threshold that is a characterization parameter agreeing with processing of the CPU processing module 100, in which if at least one said irregularity parameter exceeds its corresponding threshold, the scheduling module 500 transmit its corresponding graph data to the internal cache 200a and/or an on-chip memory 200c of the FPGA processing module 200, so that the FPGA processing module 200 can perform parallel graph processing on the graph data; and if none of the irregularity parameter exceeds the corresponding threshold, the scheduling module 500 remotely transmits active vertices of the graph data to a CPU internal cache of the CPU processing module 100, so that the CPU processing module 100 reads the graph data from the shared storage module 300 based on the active vertices and performs graph processing.

Specifically, the number of the vertices transversed in the previous layer of iteration is considered. Due the power-law distribution properties of a graph, the majority of vertices are with low degrees, yet a small portion of the total vertices have high degrees. The number of the vertices in the previous layer of iteration usually reflects a trend. If the value increases gradually, or becomes great suddenly, it means that the graph processing process is about to face a huge amount of access operations. For graph processing, a huge amount of access operations means that the process will have many out-of-order access and irregular control instructions.

The number of active vertices is considered. Due the power-law distribution properties of a graph, the majority of vertices are with low degrees, yet a small portion of the total vertices have high degrees. If scheduling is performed according to variations of memory-access regularity and control regularity during graph processing, most vertices would be assigned to the CPU, and this can cause imbalanced loads and significantly reduced utilization of the processor. Therefore, the scheduling module has to use the number of active vertices generated after operation of this vertex to dynamically assign active vertices to the CPU or FPGA data stream accelerator.

The access frequency and total access duration of the previous layer of iteration data are considered. The information intuitively tells whether data access is fast or slow during graph processing. When there is frequent out-of-order access of data, the average access efficiency of the data is lowered, and the average data reading time is extended. Graph processing has a high ratio between calculation and memory access, and the speed of graph data processing depends on the time used to access data. Based on the data access frequency and the total access duration of the previous layer of iteration, the average duration for data access can be calculated, thereby determining the variation of memory-access regularity of the graph application during calculation and making it possible to predict memory-access regularity of the next iteration. Based on this information, the decision on assigning the next iteration to the CPU or leaving it to the local FPGA data stream accelerator for processing can be made. If the memory-access regularity is poor, the computing task on the CPU is equivalent to serial execution and is relatively inefficiency. In such a case, the computing task is preferably assigned to the data-stream FPGA for processing. On the contrary, when the memory-access regularity is high, since the data-stream accelerator would consume considerable resources for token creation and communication, it is better to assign the part with high memory-access regularity to the CPU for processing.

The prediction results of branches CPU encountered in the previous layer are considered. This point can intuitively indicate the state of control regularity during graph processing. When there are too many unpredictable branches for data access, branch prediction efficiency of the CPU becomes too low for the program to predict whether the next branch will be right or wrong. Once the branch prediction is wrong, the instructions that have been loaded to the flowline will retire and the flowline has to be refreshed and rolled back to the state before that branch. The workflow is quite time-consuming. For irregular applications, such as graph processing, in case most time during execution of an application is related to poor control regularity, assigning processing of these vertices with poor control regularity to the FPGA data stream accelerator will significantly improve the efficiency of graph processing.

For the graph processing stages where control regularity and memory-access regularity are both good, maximum-level parallelism cannot be reached by the CPU due to its limited capacity of instruction issuance and execution and limited size of its instruction window. On the other hand, the data-stream execution model, benefiting from its unique features, can perform execution as soon as data arrives, and theoretically enables excellent parallelism, thereby providing better execution efficiency than a conventional CPU. Therefore, it is desirable to assign tasks with good memory-access regularity and good control regularity to the data-stream FPGA accelerator for processing.

To determine control regularity of a graph, if a vertex has been accessed, whether it has been accessed needs to be determined when it is to be accessed again. Since a structure like a graph is hard to predicted, this if determination may be true or false, without a regular pattern, making graph processing a structure with very poor control regularity. Therefore, at least one of the threads in the FPGA processing module 200 is used to count how many child vertices are adjacent to each child vertex and generate a number set. A graph structure is a net-like structure formed by common edges of plural vertices, and there is a structure satisfying power-law distribution wherein the majority of vertices have relatively few adjacent vertices, and only a small part of vertices has numerous adjacent vertices. Therefore, the present invention determines control regularity of such a net-like structure by calculating the number of adjacent vertices. The thread can use at least one of the following ways to determine whether the structure of graph data is regular (i.e. control regularity) based on the number set:

(1) calculating a ratio of a maximum number to a minimum number;
(2) calculating a ratio of the maximum number to an average number;
(3) calculating a ratio of the minimum number to an average number;
(4) calculating a ratio of the minimum number to a median of the numbers; and
(5) calculating a ratio of the maximum number to the median of the numbers.

If the ratio exceeds its corresponding threshold, it is determined that the FPGA module is more favorable than the CPU module for processing the structure in the perspective of control regularity.

Memory-access regularity indicates whether the accessed addresses in a memory are in order. The accessed number of bits is fixed, such as 32 bits or 64 bits, whether it be a DDR or a DRAM. However, edge data may take only 8 or 16 bits, and the rest of the bits are filtered out and go to waste. For a program to be accessed in order, if the data required are, for example, the first tens bits, the bits can be read through simply 2-3 times of access. In this case, data efficiency is high. On the other hand, one characteristic of graph data is random access. For example, to access a vertex 1, the serial number may be 100 or may be 10000. At this time, for memory access, data have to be taken from the vertex with the serial number of 100. The data takes 64 bits, but only 8 bits are needed, thus causing waste of memory. This is the case of poor memory-access regularity where the addresses for data access are uncertain and random. Good memory-access regularity means that the access is performed in order. To take the data of vertices numbered 100-108, the data of the 8 sites can be accessed directly, and this is an example of good memory-access regularity opposite to graph processing where data access is random and has poor memory-access regularity.

The scheduling module 500 assign tasks during operation of a graph processing application according to the foregoing preset access rules. It assigns one part of a graph to the CPU for execution, and assigns the other part to the data-stream FPGA accelerator for execution. For the two to share one common DRAM, the scheduling module assigns tasks by sending active vertices to be processed to the CPU through PCIE, and the CPU gets the data of the corresponding original points and target vertices through the shared DRAM. The FPGA reads the active vertices to be processed directly from the local cache, and then gets the data of the corresponding original points and target vertices from the shared DRAM.

After the FPGA processing module 200 has done the graph processing on the graph data of the previous layer of iteration and/or while the CPU processing module 100 performs graph processing on the graph data of the previous layer of iteration, the FPGA processing module 200 performs graph traversal on the graph data of the next layer. Therefore, preferably, the shared storage module 300 and the on-chip memory 200c are in communicative connection, so that while the FPGA processing module 200 performs graph traversal on the graph data of the previous layer of iteration and/or while the FPGA processing module 200 performs graph processing on the graph data of the previous layer of iteration, the on-chip memory 200c can read the graph data to be processed in the next layer. After the FPGA processing module 200 has done the graph processing on the graph data of the previous layer of iteration and/or while the CPU processing module 100 performs graph processing on the graph data of the previous layer of iteration, the graph data of the next layer to be processed can receive graph traversal without waiting for the shared storage module 300 to transmit the graph data of the next layer to be processed to the FPGA processing module 200. By doing so, seamless switching between the CPU processing module 100 and the FPGA module can be achieved to address technical problem such as follows: when the system is switched from the CPU to the FPGA, the CPU has to stop, and when the system is switched from the FPGA to the CPU, the FPGA has to stop. The switching involves frequent control works, and is more complicated than performing the entire traversal process on a single processor.

Embodiment 2

The present embodiment discloses an optimization system for graph processing that is capable of implementing Embodiment 1. Without causing conflict or contradiction, the entire and/or part of preferred modes of other embodiments may be incorporated into the present embodiment as supplements.

By committing the entire graph processing process to the foregoing CPU-FPGA combination, the known graph processing structure obtains the advantages of using both an FPGA and a CPU alone, but has the following disadvantages. First, to switch the system form the CPU to the FPGA or vice versa, the processor has to stop the current program operation, save the current operational state and processing data, transmit the data to the relevant processor through the PCIe channel, and then resume the operational state. This process is quite time-consuming and may take more than 20% of the total program execution time. Second, when the system is switched from the CPU to the FPGA, the CPU has to stop, and when the system is switched from the FPGA to the CPU, the FPGA has to stop. The switching involves frequent control works, and is more complicated than performing the entire traversal process on a single processor.

By analyzing and summarizing the shortcomings of the conventional CPUs in running graph processing applications, it is clear that a CPU tends to be limited by its low bandwidth, low instruction-level parallelism, and inefficient branch prediction when running a graph processing application and fail to provide efficient graph processing. However, by combining the complementary advantages of a CPU and an FPGA, the FPGA can use its editability to create a data stream execution model for graph processing and address the shortcomings of the CPU in graph processing. This allows making the best use of the respective structural characteristics of the CPU and the FPGA, and leveraging the benefit of parallel execution of graph traversal, thereby optimizing execution of graph traversal.

The optimization system for graph processing is a datastream optimization system for graph processing based on a CPU+FPGA heterogeneous structure. As shown in FIG. 1, the optimization system comprises a CPU processing module 100, an FPGA processing module 200, a shared storage module 300, an integration module 400 and a scheduling module 500. The CPU processing module 100 is made of a CPU chip and has graph processing functions. The FPGA processing module 200 is made of an FPGA chip and has graph processing functions. The shared storage module 300 is a DRAM. The integration module 400 has computing functions and can integrate a CPU graph processing result and an FPGA graph processing result into a graph processing result. The scheduling module 500 has computing functions and can assign data streams in graph data to the CPU processing module 100 and the FPGA processing module 200 according to preset access rules. The optimization system further comprises a communication module that enables communication among the foregoing modules as depicted in FIG. 1.

The objective of the optimization system is to send graph data to the CPU processing module 100 and the FPGA processing module 200 for dynamic acceleration processing, respectively, through task assignment based on the power-law distribution properties of a graph, so that the FPGA processing module 200 can work with the CPU processing module 100 to process the irregular data streams in graph data while balancing the processing loads between the CPU processing module 100 and the FPGA processing module 200 caused by irregularity of the graph data, so as to obtain a graph processing result.

The power-law distribution property of graphs: in graph data, the majority of vertices are of low degrees and the minority of vertices has high degrees.

The shared storage module 300 stores the graph data intended to receive graph processing.

The CPU processing module 100 and the FPGA processing module 200 are communicatively connected with the shared storage module 300, respectively in a parallel manner, so as to enable the CPU processing module 100 and the FPGA processing module 200 to each read at least a part of the graph data in a real-time manner. The CPU processing module 100 and/or the FPGA processing module 200 each performs graph processing on the at least one part the graph data it reads so as to obtain the CPU graph processing result and/or the FPGA graph processing result, respectively.

The FPGA processing module 200 reads the graph data stored in the shared storage module 300 and, before performing graph processing on the graph data, performs traversal on the graph data based on the power-law distribution properties of the graph data in virtue of editability (please ask the inventor to further define the term "editability") of the FPGA processing module 200, so as to acquire at least one irregularity parameter of the irregular data streams in the graph data. The irregularity parameter includes at least one of the access irregularity parameter and the control irregularity parameter.

The scheduling module 500 assigns the part of the graph data that agree with the CPU processing module 100 to the CPU processing module 100 for graph processing, so as to obtain the CPU graph processing result, and assigns the other part to the FPGA processing module 200 that has a parallel processing function for graph processing, so as to obtain the FPGA graph processing result by means of matching the at least one irregularity parameter with preset access rules agreeing with the irregularity parameter.

Preferably, the scheduling module 500 are in communicative connection with the FPGA processing module 200 that has at least two threads that can be parallelly processed in a manner that the scheduling module 500 can perform local access, so that the FPGA processing module 200 when performing traversal on the graph data writes the part of the graph data that disagrees with the CPU processing module 100 into an internal cache 200a in the FPGA processing module 200 corresponding to the at least two threads in a way that allowing parallel processing, so that the FPGA processing module 200 acts as a heterogeneous graph processing accelerator of the CPU processing module 100 and performs parallel graph processing on the part of the graph data that disagree with processing of the CPU processing module 100 in a way that saves communication time writing time, thereby balancing the processing loads between the CPU processing module 100 and the FPGA processing module 200 caused by irregularity of the graph data.

Embodiment 3

The present embodiment discloses a scheduling method for graph data based on a CPU+FPGA heterogeneous system. Without causing conflict or contradiction, the entire and/or part of preferred modes of other embodiments may be incorporated into the present embodiment as supplements.

The scheduling method can divide irregular data streams according to at least one parameter of the irregular data streams in the graph data in virtue of editability of the FPGA, so as to benefit from the respective structural advantages of the FPGA processing module 200 and the CPU processing module 100 and achieve coherent acceleration processing of graph data.

The FPGA processing module 200 reads the graph data stored in the shared storage module 300 and, before performing graph processing on the graph data, performs traversal on the graph data based on the power-law distribution properties of the graph data in virtue of editability of the FPGA processing module 200, so as to acquire at least one irregularity parameter of the irregular data streams in the graph data. The scheduling module 500 assigns the part of the graph data that agree with the CPU processing module 100 to the CPU processing module 100 for graph processing, so as to obtain the CPU graph processing result, and assigns the other part to the FPGA processing module 200 that has a parallel processing function for graph processing, so as to obtain the FPGA graph processing result by means of matching the at least one irregularity parameter with preset access rules agreeing with the irregularity parameter.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. An optimization method for graph processing based on heterogeneous FPGA data streams, especially an optimization method for graph processing of data streams based on a CPU+FPGA heterogeneous structure, involving sending graph data to a CPU processing module and an FPGA processing module by task assignment, respectively, according to power-law distribution properties of a graph for dynamic acceleration, so that the FPGA processing module works with the CPU processing module to process irregular data streams in the graph data and thereby obtain a graph processing result;

the optimization method comprising:
storing graph data to be graph processed in a shared storage module;
the CPU processing module and the FPGA processing module communicatively connecting with the shared storage module, respectively in a parallel manner, so as to enable the CPU processing module and the FPGA processing module to each read at least a part of the graph data—real-time manner—, so that the CPU processing module and/or the FPGA processing module perform graph processing on the respective parts of the graph data they read, thereby obtaining a CPU graph processing result and/or an FPGA graph processing result; and
an integration module integrating the CPU graph processing result and/or the FPGA graph processing result, so as to obtain the graph processing result,
the optimization method being characterized in,
the FPGA processing module reading the graph data stored in the shared storage module and, before performing graph processing on the graph data, performing traversal on the graph data based on the power-law distribution properties of the graph data based on editability of the FPGA processing module, so as to acquire at least one irregularity parameter of the irregular data streams in the graph data, and
a scheduling module assigning a part of the graph data that agrees with the CPU processing module to the CPU processing module for graph processing, so as to obtain the CPU graph processing result, and assigning the other part to the FPGA processing module that has a parallel processing function for graph processing, so as to obtain the FPGA graph processing result by means of matching the at least one irregularity parameter with preset access rules agreeing with the irregularity parameter;
wherein the scheduling module is in communicative connection with the FPGA processing module that has at least two threads that can be parallelly processed in a manner that the scheduling module can perform local access, so that the FPGA processing module, when performing traversal on the graph data, writes the part of the graph data that disagrees with the CPU processing module into an internal cache in the FPGA processing module corresponding to the at least two threads in a way that parallel processing is allowed, so that the FPGA processing module acts as a heterogeneous graph processing accelerator of the CPU processing module and performs parallel graph processing on the part of the graph data that disagree with processing of the CPU processing module in a way that saves communication time and writing time; and
wherein at least one thread in the FPGA processing module is configured to perform traversal on the graph data following preset traversal rules in virtue of the editability of the FPGA processing module, and the at least one thread is in communicative connection with the scheduling module through a local cache, the at least one thread performing traversal through at least steps of:

selecting at least one child vertex from the graph data as a start point for traversal;
reading child vertex data of the at least one child vertex;
according to a structure of the graph data, reading target child vertices adjacent to the child vertex and edges between two adjacent child vertices;
reading child vertex data of the target child vertices and edge data of the edges; and
loading the child vertex data of the at least one child vertex, the target child vertices, the edges of two adjacent child vertices, child vertex data of other child vertices and edge data of the edges to the local cache of the FPGA processing module, so that the scheduling module calculates at least one irregularity parameter of the graph data locally in a way that saves communication time and writing time.

2. The optimization method of claim 1, wherein the scheduling module compares the at least one irregularity parameter reading with a corresponding threshold that is a characterization parameter agreeing with processing of the CPU processing module, in which:
  if at least one said irregularity parameter exceeds its corresponding threshold, the scheduling module transmits its corresponding graph data to the FPGA internal cache and/or an on-chip memory, so that the FPGA processing module can perform parallel graph processing on the graph data; and
  if none of the irregularity parameter exceeds the corresponding threshold, the scheduling module remotely transmits active vertices of the graph data to a CPU internal cache of the CPU processing module, so that the CPU processing module reads the graph data from the shared storage module based on the active vertices and performs graph processing.

3. The optimization method of claim 2, wherein the shared storage module is in communicative connection with the at least one thread through the on-chip memory, so that while the FPGA processing module performs graph traversal on the graph data of a previous layer of iteration and/or while the FPGA processing module performs graph processing on the graph data of a previous layer of iteration, the on-chip memory reads the graph data to be processed in a next layer, so that after the FPGA processing module has done the graph processing on the graph data of the previous layer of iteration and/or while the CPU processing module performs graph processing on the graph data of the previous layer of iteration, the graph data of the next layer to be processed can receive graph traversal directly without waiting for the shared storage module to transmit the graph data of the next layer to be processed to the FPGA processing module.

4. The optimization method of claim 3, wherein at least one said thread in the FPGA processing module is used to count a number of adjacent child vertices for every said child vertex and generate a number set, and the thread can determine whether the structure of the graph data is regular according to the number set by at least one of:
  calculating a ratio of a maximum number to a minimum number;
  calculating a ratio of the maximum number to an average number;
  calculating a ratio of the minimum number to an average number;
  calculating a ratio of the minimum number to a median of the numbers; and
  calculating a ratio of the maximum number to the median of the numbers.

5. The optimization method of claim 4, wherein the FPGA module uses data access frequency of the previous layer of iteration and total access duration to calculate average access duration of every said vertex data, thereby identifying change of a graph application in memory-access regularity during calculation, so as to calculate the memory-access regularity for next iteration that is used by the scheduling module to determine whether it is assigned to a CPU for processing or left in a local FPGA data stream accelerator for processing.

6. An optimization system for graph processing based on heterogeneous FPGA data streams, especially an optimization system for graph processing s based on a CPU+FPGA heterogeneous structure, which is able to send graph data to a CPU processing module and an FPGA processing module by task assignment, respectively, according to power-law distribution properties of a graph for dynamic acceleration, so that the FPGA processing module works with the CPU processing module to process irregular data streams in the graph data while balancing processing loads between the CPU processing module and the FPGA processing module caused by irregularity of the graph data and thereby obtain a graph processing result, the system comprising:
  a shared storage module, for storing the graph data intended to receive graph processing;
  the CPU processing module;
  and the FPGA processing module;
  wherein the CPU processing module and the FPGA processing module are communicatively connected with the shared storage module, respectively in a parallel manner, so as to enable the CPU processing module and the FPGA processing module to each read at least a part of the graph data in a real-time manner, so that the CPU processing module and/or the FPGA processing module (200) perform graph processing on the respective parts of the graph data they read, thereby obtaining a CPU graph processing result and/or an FPGA graph processing result; and
  an integration module integrating the CPU graph processing result and/or the FPGA graph processing result, so as to obtain the graph processing result,
  the optimization system being characterized in,
  the FPGA processing module reading the graph data stored in the shared storage module and, before performing graph processing on the graph data, performing traversal on the graph data based on the power-law distribution properties of the graph data based on editability of the FPGA processing module, so as to acquire at least one irregularity parameter of the irregular data streams in the graph data, and
  a scheduling module assigning a part of the graph data that agree with the CPU processing module to the CPU processing module for graph processing, so as to obtain the CPU graph processing result, and assigning the other part to the FPGA processing module that has a parallel processing function for graph processing, so as to obtain the FPGA graph processing result by means of matching the at least one irregularity parameter with preset access rules agreeing with the irregularity parameter;
  wherein the scheduling module is in communicative connection with the FPGA processing module that has at least two threads that can be parallelly processed in a manner that the scheduling module can perform local access, so that the FPGA processing module, when performing traversal on the graph data, writes the part of the graph data that disagrees with the CPU processing module into an internal cache in the FPGA processing module corresponding to the at least two threads in a way that parallel processing is allowed, so that the FPGA processing module acts as a heterogeneous graph processing accelerator of the CPU processing module and performs parallel graph processing on the part of the graph data that disagree with processing of the CPU processing module in a way that saves communication time and writing time; and wherein at least one thread in the FPGA processing module is configured to perform traversal on the graph data following preset traversal rules in virtue of the editability of the FPGA processing module, and the at least one thread is in communicative connection with the scheduling module through a local cache, the at least one thread performing traversal through at least steps of:

selecting at least one child vertex from the graph data as a start point for traversal;

reading child vertex data of the at least one child vertex;

according to a structure of the graph data, reading target child vertices adjacent to the child vertex and edges between two adjacent child vertices;

reading child vertex data of the target child vertices and edge data of the edges; and loading the child vertex data of the at least one child vertex, the target child vertices, the edges of two adjacent child vertices, child vertex data of other child vertices and edge data of the edges to the local cache of the FPGA processing module, so that the scheduling module calculates at least one irregularity parameter of the graph data locally in a way that saves communication time and writing time.

7. A scheduling method for graph data based on a CPU+FPGA heterogeneous system, being configured to divide irregular data streams of the graph data according to at least one parameter of the irregular data streams in virtue of editability of an FPGA, so as to leverage respective advantages of an FPGA processing module and a CPU processing module to perform coherent acceleration on the graph data, the scheduling method being characterized in, the FPGA processing module reading the graph data stored in the shared storage module and, before performing graph processing on the graph data, performing traversal on the graph data based on the power-law distribution properties of the graph data based on editability of the FPGA processing module, so as to acquire at least one irregularity parameter of the irregular data streams in the graph data, and a scheduling module assigning a part of the graph data that agree with the CPU processing module to the CPU processing module for graph processing, so as to obtain the CPU graph processing result, and assigning the other part to the FPGA processing module that has a parallel processing function for graph processing, so as to obtain the FPGA graph processing result by means of matching the at least one irregularity parameter with preset access rules agreeing with the irregularity parameter;

wherein the scheduling module is in communicative connection with the FPGA processing module that has at least two threads that can be parallelly processed in a manner that the scheduling module can perform local access, so that the FPGA processing module, when performing traversal on the graph data, writes the part of the graph data that disagrees with the CPU processing module (100) into an internal cache (200*a*) in the FPGA processing module (200) corresponding to the at least two threads in a way that parallel processing is allowed, so that the FPGA processing module acts as a heterogeneous graph processing accelerator of the CPU processing module and performs parallel graph processing on the part of the graph data that disagree with processing of the CPU processing module in a way that saves communication time and writing time; and wherein at least one thread in the FPGA processing module is configured to perform traversal on the graph data following preset traversal rules in virtue of the editability of the FPGA processing module, and the at least one thread is in communicative connection with the scheduling module through a local cache, the at least one thread performing traversal through at least steps of:

selecting at least one child vertex from the graph data as a start point for traversal;

reading child vertex data of the at least one child vertex;

according to a structure of the graph data, reading target child vertices adjacent to the child vertex and edges between two adjacent child vertices;

reading child vertex data of the target child vertices and edge data of the edges; and loading the child vertex data of the at least one child vertex, the target child vertices, the edges of two adjacent child vertices, child vertex data of other child vertices and edge data of the edges to the local cache of the FPGA processing module, so that the scheduling module calculates at least one irregularity parameter of the graph data locally in a way that saves communication time and writing time.

\* \* \* \* \*